April 5, 1966 O. J. OTT 3,244,996

CLASS A B COMPLEMENTARY DIRECT COUPLED TRANSISTOR AMPLIFIER

Filed July 23, 1963

INVENTOR
OWEN J. OTT
BY Kenyon & Kenyon
ATTORNEYS

United States Patent Office 3,244,996
Patented Apr. 5, 1966

3,244,996

CLASS AB COMPLEMENTARY DIRECT COUPLED TRANSISTOR AMPLIFIER

Owen J. Ott, Brookfield, Conn., assignor to Data-Control Systems, Inc., Danbury, Conn., a corporation of Delaware Filed July 23, 1963, Ser. No. 297,108
6 Claims. (Cl. 330—15)

Figure 1:
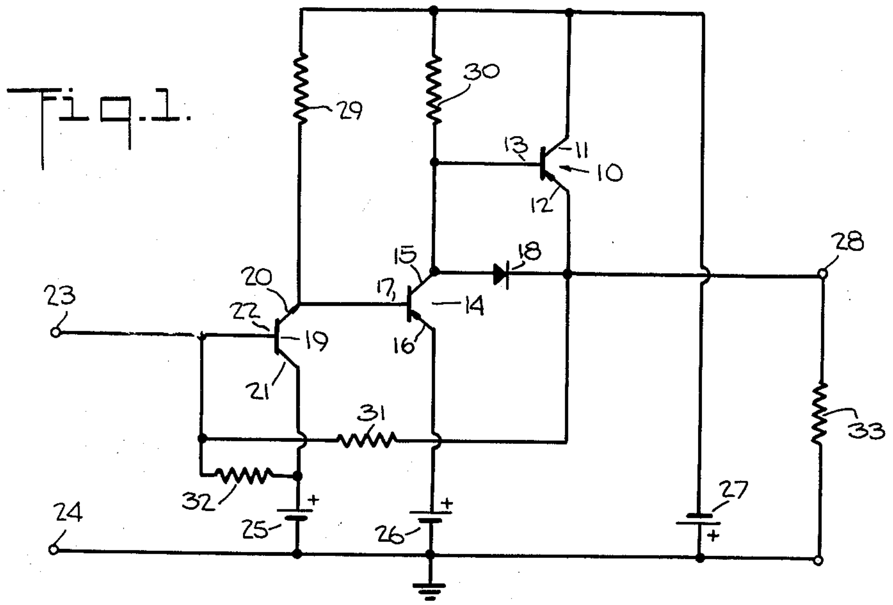

This invention relates in general to transistor amplifiers, and particularly to Class AB transistor amplifier circuits.

Class AB push-pull amplifier circuits are advantageous by reason of generally efficient operation and relatively low power supply requirements. The conventional type of Class AB push-pull circuits require transformers for coupling the output stages to the load, and such transformers are relatively heavy, costly and suffer from other disadvantages. Thus, for example, circuits requiring a transformer have poor low frequency response because the transformer is not operative at low frequency or D.C. signals.

With the advent of transistors, it was possible to eliminate the transformer by utilizing a pair of transistors of opposite conductivity type as the power output stages. This type of circuit, which is sometimes referred to as a complementary symmetry Class B push-pull circuit, has many desirable features. However, a disadvantage of such a circuit is that the operating characteristics of the opposite conductivity type transistors must be very nearly symmetrical, and this requires careful attention to the matching of transistors. U.S. Patent 2,810,024 discloses an amplifier circuit utilizing a pair of transistors of opposite conductivity type as the power output stage.

Class B push-pull circuits have also been devised using transistors of the same conductivity type. In these circuits, in which a transformer is not necessary, a pair of transistors of the same conductivity type are used for supplying amplified signals to a load. A circuit of this type is disclosed in U.S. Patent 2,943,266.

In amplifier circuits in which the power output stage involves the use of a pair of transistors of the opposite conductivity type, the transistors are generally operated as emitter-followers. Accordingly, the driver stage must supply a voltage swing which is equal to the load voltage swing. Such a requirement generally decreases the efficiency of power transfer to the load by increasing the amount of power which the amplifier itself dissipates. In addition, such a circuit requires the use of a driver transistor which has a high power rating, and this increases the overall cost of the amplifier circuit.

Another disadvantage stemming from the requirement that the driver transistor have a high power rating is that such a transistor does not generally have good frequency response. Accordingly, the use of such a circuit configuration requires either that a sacrifice be made in frequency response or that the design of the overall circuit include some compensating network to provide improved frequency response.

Accordingly, it is an object of this invention to provide a Class AB transistor amplifier circuit which operates without a transformer and which provides good frequency response.

It is a further object of this invention to provide a Class AB transistor amplifier circuit in which the driver stage operates with a low level of output voltage swing.

It is a further object of this invention to provide a Class AB transistor amplifier circuit which has low power requirements in both its quiescent and active states, and which furnishes an output having good frequency response, linearity, and stability of operation.

It is another object of this invention to provide a Class AB amplifier circuit in which a feed-back loop is utilized to provide zero stability, to minimize distortion, and to provide symmetrical gain on positive and negative signal input swings.

Briefly stated, one embodiment of the present invention is a signal amplifier circuit comprising, in combination, a Class AB push-pull output stage comprising first and second transistors of the same conductivity type, each transistor including base, emitter, and collector elements, means connecting the collector element of said first transistor to the base element of said second transistor, unidirectional conducting means connecting the collector element of said first transistor with the emitter element of said second transistor, means providing an output circuit connected with the emitter element of said second transistor, a driver stage comprising a third transistor of conductivity type opposite to that of said first and said second transistors and including base, emitter, and collector elements, signal input circuit means connected for applying an input signal to the base element of said third transistor, and means connecting the emitter element of said third transistor with the base element of said first transistor, said third transistor being operative on one half-cycle of said applied input signal to increase the conduction of said first transistor while decreasing the conduction of said second transistor, and said third transistor being operative on the other half-cycle of said input signal to increase the conduction of said second transistor while decreasing the conduction of said first transistor.

Figure 2:
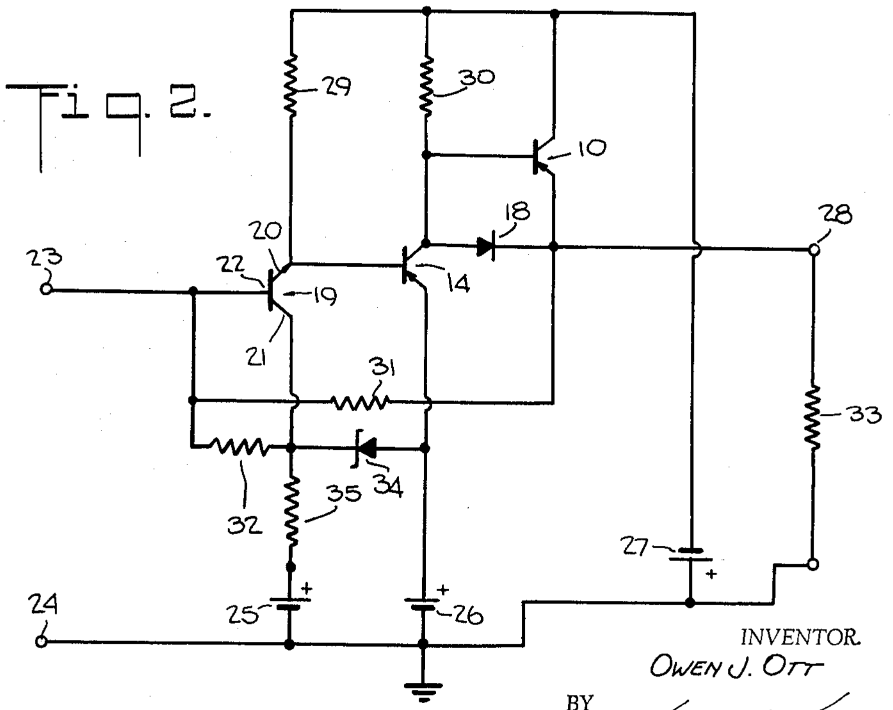

The invention will be more readily understood when described in conjunction with the drawings in which:

FIG. 1 is a schematic diagram of one circuit embodying the principles of the present invention, and FIG. 2 is a schematic diagram of a second circuit embodying the principles of this invention.

With respect now to FIG. 1 there is depicted output stage transistor 10 having collector element 11, emitter element 12 and base element 13. A second output stage transistor 14, of the same conductivity type as transistor 10, is shown as having collector element 15, emitter element 16 and base element 17. The collector element 15 is connected through semiconductor diode 18 to the emitter element 12 of transistor 10.

The driver stage transistor 19, of conductivity type opposite to that of transistors 10 and 14, is shown as having emitter element 20, collector element 21 and base element 22. Emitter element 20 is directly connected to base element 17 of transistor 14.

Base element 22 of transistor 19 is connected to input terminal 23. A second input terminal 24 is shown as connected to ground or reference potential.

In the configuration shown in FIG. 1, transistor 19 is of NPN conductivity type, and transistors 10 and 14 are of PNP conductivity type. With this choice of transistor types, the collector element 21 of transistor 19 is connected to the positive side of D.C. potential source 25. The negative side of source 25 is connected to ground.

Emitter element 16 of transistor 14 is connected to the positive side of D.C. potential source 26, and the negative side of source 26 is connected to ground.

Collector element 11 of transistor 10 is connected to the negative side of D.C. potential source 27. The positive side of source 27 is connected to ground.

Output terminal 28 is connected to the emitter element 12 of transistor 10. Load 33, shown in the drawing as a resistor, is connected between output terminal 28 and ground.

Resistor 29 is connected between emitter element 20 of transistor 19 and the negative side of source 27. Resistor 30 is connected between the collector element 15 of transistor 14 and the negative side of source 27.

Feedback resistor 31 is connected between output terminal 28 and input terminal 23.

Resistor 32 is connected between base element 22 of transistor 19 and the positive side of potential source 25 in order to provide bias for transistor 19.

Transistors 10 and 14 operate in push-pull to provide an output signal across load 33. On positive input signal swings, transistor 10 provides the output signal. Transistor 14 is not cut off on positive input signal swings, but the conduction therethrough is at very low levels.

On negative input swings, transistor 14 provides the output signal. In such instance, transistor 10 is cut off and there is no conduction therethrough.

Transistor 19 is operated with Class A bias. To this end, source 25 is chosen to have a value larger than source 26 in order to provide the necessary forward bias on transistor 19. To facilitate the explanation of the circuit shown in FIG. 1, assume that source 25 has a value of 25 volts, source 26 has a value of 20 volts, and source 27 has a value of 20 volts.

At zero input signal, in the quiescent state, the potential level at output terminal 28 is equal to ground potential or zero volts. The value of feedback resistor 31 is chosen with a view to the gain which is desired. In the embodiment in FIG. 1, assume that resistor 31 has a value of 1000 ohms. This will provide a 1 volt output for an input current of 1 milliampere.

Resistor 32 is connected in series with resistor 31 between output terminal 28 and potential source 25. The value of resistor 32 is chosen to provide the necessary forward bias on transistor 19. As is well known, there is only a small potential difference between the emitter element and the base element of a conducting transistor. In the circuit shown in FIG. 1, in the quiescent state, transistors 10, 14, and 19 are all conducting. Accordingly, the base element 17 of transistor 14 will be at approximately the same potential as emitter element 16, and this value is equal to +20 volts.

As can be seen in FIG. 1, emitter element 20 of transistor 19 is directly connected to base element 17 of transistor 14. Accordingly emitter element 20 will also be at approximately +20 volts. Thus it is necessary to size resistor 32 to provide a potential at base element 22 of approximately 20 volts. With source 25 having a potential of 25 volts, base element 22 will be at approximately +20 volts if a 5-volt drop is taken across resistor 32. This would leave 20 volts to be taken across resistor 31. With resistor 31 sized at 1000 ohms, the current flowing from source 25 to terminal 28 through resistors 31 and 32 will be 20 milliamperes. A current of 20 milliamperes flowing through resistor 32 will provide the desired 5-volt potential drop.

Conventional design techniques indicate that the maximum output signal excursions in the load 33 should approach within approximately 5 volts the value of potential source 27. Thus when output terminal 28 is at its maximum negative potential level, the value should be equal to approximately −15 volts. In the circuit shown in FIG. 1, there is an inversion between the input signal and the output signal. Accordingly, a negative output signal is indicative of the introduction of a positive input signal at input terminal 23. As stated above, transistor 10 provides the output signal on positive input voltage swings. With a potential of −15 volts at output terminal 28, the potential at emitter element 12 of transistor 10 will also be −15 volts. It follows that the potential level at base element 13 of transistor 10 will also be at approximately −15 volts. Looking now at resistor 30 it can be seen from the value of source 27 that there must be a voltage drop across resistor 30 equal to approximately −5 volts.

In designing the circuit shown in FIG. 1, an output current of 1.5 amperes through load 33 was assumed as desirable for an input signal of maximum level. This fixes the resistance of load 33 at 10 ohms. Conventional power transistors of the type employed for transistors 10 and 14 would require a base-emitter current of approximately 50 milliamperes for an emitter-collector current of 1.5 amperes. The 50 milliamperes of base-emitter current of transistor 10 will flow through resistor 30 to potential source 27. On input swings at maximum positive level, transistor 14, although not cut off is conducting at a very low level. Ignoring the minimal current flowing through transistor 14 in such instance there would be approximately 50 milliamperes flowing through resistor 30. Since, as indicated above, there is required a voltage drop of 5 volts across resistor 30, resistor 30 is sized at 100 ohms.

On negative signal input swings equal to maximum level, transistor 14 provides the output signal and transistor 10 is cut off. On such full limit negative input swings, transistor 19 will also approach cut off. To provide for symmetrical operation, the circuit is designed to provide 1.5 amperes in the emitter-collector circuit of transistor 14 under these conditions. This 1.5 amperes is the current which flows through load 33. This requires 50 milliamperes of current in the base-emitter circuit of transistor 14, and this current flows through resistor 29 to source 27. The potential level at base element 17 will be approximately equal to that at emitter element 16, and this value is +20 volts. Looking at resistor 29, there is a potential level of +20 volts on one side and a potential level of −20 volts on the other side, the latter being occasioned by the negative potential of source 27. Thus there is a potential drop of 40 volts across resistor 29 with a current therethrough of 50 milliamperes. This dictates the size of resistor 29 at 800 ohms.

The operation of the circuit in its quiescent state will now be described. As discussed above, resistor 32 is sized to provide a potential level of +20 volts at base element 22 of transistor 19. Transistor 19 must be forward biased and therefore the base element 22 must be positive with respect to emitter element 20 by a few tenths of a volt. The choice of resistors 31 and 32 provides this forward bias.

Since transistor 19 is forward biased, part of the current in resistor 29 is supplied by the emitter 20 of transistor 19. The remainder of the current in resistor 29 is supplied by base 17 of transistor 14, causing transistor 14 to conduct by an amount sufficient to maintain output terminal 28 at ground potential.

Thus, at quiescent condition, output terminal 28 is at ground potential. Therefore the collector element 15 of transistor 14, which is connected to output terminal 28 through diode 18, is also at or near ground potential. Accordingly there must be a potential drop across resistor 30 equal to the value of source 27, or a voltage drop of 20 volts. Since resistor 30 is 100 ohms, this indicates a current of approximately 200 milliamperes flowing therethrough. This current is supplied by transistor 14.

Since transistor 10 is conducting in the quiescent state, it is necessary that base element 13 be at a potenital level slightly negative with respect to emitter element 12. Since emitter element 12 is at zero potential, base element 13 is necessarily at a negative potential of a few tenths of a volt. In order to achieve this condition, the current flowing through resistor 30 must be somewhat less than 200 milliamperes, for example 198 milliamperes. This current will give a potential level at base element 13 of −0.2 volt, thereby forward biasing transistor 10.

To illustrate the manner in which the circuit of FIG. 1 tends to be self-balancing so as to provide a potential level at output terminal 28 of zero volt in the quiescent state, assume a situation in which the potential level at output terminal 28 is slightly negative. Under such conditions, the current through resistors 32 and 31 would increase. This would result in an increase in the voltage drop across resistor 32, thereby decreasing the voltage at base element 22 of transistor 19.

Since transistor 19 is NPN conductivity type, a decrease in potential at base element 22 will cause transistor 19 to conduct less. This will cause a decrease in current through resistor 29 with a consequent decrease in potential drop thereacross. The potential level at base element 17, in turn, will decrease thereby causing transistor 14 to conduct more heavily.

If transistor 14 conducts more heavily, the voltage drop across resistor 30 will increase and this will drive collector element 15 of transistor 14 more positive. If the potential level at collector 15 goes in a positive direction, this change will be transmitted by diode 18 to output terminal 28, thereby driving output terminal 28 in a positive direction. Thus the tendency of output terminal 28 to go in a negative direction is counterbalanced by operation of the circuit to cause it to move in a positive direction.

Similar analysis will show that tendency of output terminal 28 to move in a positive direction results in a negative potential being transmitted to this point through the circuit.

The manner in which the circuit of FIG. 1 amplifies input signals will now be described. Assume that a positive going signal current is impressed across input terminals 23 and 24. This will cause base element 22 of transistor 19 to move in a positive direction with respect to emitter element 20. Accordingly transistor 19 conducts more heavily. This in turn causes the emitter-base current of transistor 14 to decrease. The latter condition occurs in the following manner.

When the current through transistor 19 increases by reason of the positive signal on base element 22, the voltage drop across resistor 29 tends to increase. Such an increase in potential drop causes base element 17 of transistor 14 to assume a more positive potential with respect to emitter element 16. This in turn causes transistor 14 to move toward cut-off and therefore it conducts less heavily.

With the reduced emitter-collector current through transistor 14 and resistor 30, the potential drop across resistor 30 decreases. This causes the potential level at collector element 15 of transistor 14 to move in a negative direction. Diode 18 is cut off. Since base element 13 of transistor 10 is connected to this point, it too moves in a negative direction, thereby increasing the emitter-base forward bias of transistor 10. Accordingly, transistor 10 conducts more heavily. The increase in current flow through transistor 10 is provided by current which flows from ground up through load 33 to emitter element 12 of transistor 10. With current flowing through load 33 in this direction, there is provided a negative voltage output at terminal 28.

Thus, for a positive input current, the conduction of transistor 14 decreased and the conduction of transistor 10 increased, thereby providing a negative output at terminal 28.

It can be seen that the output voltage appears at the emitter element 12 of transistor 10. The driver transistor 19 is not exposed to substantial voltage swings, and therefore transistor 19 need not be designed for large power dissipation. It is this feature which is one of the substantial advantages of the circuit shown in FIG. 1.

Now take the situation in which a negative signal current is impressed across input terminals 23 and 24. With a negative potential appearing at base element 22 of transistor 19, there is less conduction through transistor 19. Accordingly the potential at base element 17 of transistor 14 moves in a negative direction. This causes transistor 14 to conduct more heavily. The increase in conduction of transistor 14 also increases the emitter-base current and therefore the potential swing at base element 17 is decreased. In other words, the decrease in conduction of transistor 19 is offset by the increase in emitter-base current of transistor 14.

The increase in conduction of transistor 14 drives collector 15 in a positive direction. Accordingly diode

18 conducts, thereby driving output terminal 28 in a positive direction.

Collector element 15 is directly connected to base element 13 of transistor 10 and therefore base element will be more positive than emitter element 12 by a value equal to the potential drop across diode 18, and transistor 10 will therefore be cut off. The increase in current flow through transistor 14 passes through diode 18 and down through load 33 to ground, thereby providing a positive output signal.

In the description above, it was indicated that in the quiescent state, transistor 10 conducts slightly by reason of the fact that base element 13 is slightly negative with respect to the potential at emitter element 12. The following analysis is to show that transistor 10 must be conducting in the quiescent state, and that the circuit will balance itself to bring about this condition.

Assume that the base element 13 of transistor 10 is at a positive potenital so as to cut off transistor 10. The potential level of base 13 is controlled by the current flowing through resistor 30 and an increase in potential level at base element 13 requires an increase in current through resistor 30.

If transistor 10 is cut off, or is approaching cut off, the current flowing through resistor 32 and 31 decreases. A decrease in current flow through resistor 32 would cause base element 22 of transistor 19 to move in a positive direction. This is equivalent to the introduction of a positive input signal, and as indicated above, under such conditions transistor 19 conducts more heavily and transistor 14 conducts less heavily. With a decrease in conduction through transistor 14, the potential level at the collector element 15 of transistor 14 will decrease due to a decrease in voltage drop across resistor 30. Thus the potential level at base element 13, which is directly connected to collector element 15, will decrease thereby providing forward bias for transistor 10 and causing transistor 10 to conduct.

Referring now to FIGURE 2, it will be noted that this is an electrical schematic of an alternative embodiment of this invention. The main differences shown in this embodiment over that shown in FIGURE 1 consist in the addition of resistor 35 and zener diode 34. Resistor 35 and zener diode 34 coact to provide collector bias for transistor 19.

Zener diodes are well known to the art. Basically, they are semiconductors which are reverse-biased in normal operating conditions. As the reverse-bias voltage increases in amount, the resistance of the semiconductor to current flow remains high until a critical voltage is reached, at which point the resistance of the diode drops sharply. Once the reverse-bias is above this critical value, the voltage across the diode remains fixed if the reverse-bias is further increased and only the current through the diode increases. These characteristics of zener diodes make them particularly suitable for use in transistor circuits as voltage regulators. This is the primary function of the zener diode in FIGURE 2. It serves both as a low impedance source of D.C. bias and also to prevent the application of too high a voltage to the collector of transistor 19.

Resistor 35 is primarily a dropping resistor having a resistance value such that the current passing through zener diode 34 does not exceed the maximum current or power dissipation rating of the diode. As long as the bias across zener diode 34 is more than its critical value, current through resistor 35 remains constant regardless of the total current through driver transistor 19, current through the zener diode decreasing by an amount equal to the increase in the current through the driver transistor. In this way the potential at the collector of driver transistor 19 remains constant.

The embodiments shown in FIGS. 1 and 2 above involve the use of an NPN conductivity type transistor as the driver, and PNP transistors for the output stages. The principles upon which the present invention are based will operate equally well if a PNP driver transistor is used with NPN power transistors. Of course, the circuits would have to be modified by reversing the polarities of the various potential sources and reversing the diode polarities.

The output linearity and other characteristics of the embodiment shown in FIGURE 1 are further aided by feedback resistor 31. This resistor is connected between the emitter element 12 of output transistor 10 and the base element 22 of driver transistor 14, thereby providing degenerative current feedback. One purpose for this resistor is to provide symmetrical power gain for positive and negative input signals.

When the input signal is positive, output transistor 10 is the current amplifying element. Its load is primarily load 33. When the input signal in negative going, transistor 10 is cut off and transistor 14 is the current amplifying element. Its load consists of load 33 in parallel with resistor 30. Thus, depending mainly upon the input polarity, the voltage gain of transistor 14 may vary substantially, since for positive inputs the load is buffered by transistor 10, but for negative inputs it is not. The inclusion of feedback resistor 31 mitigates this condition and serves to provide an essentially symmetrical output. Feedback resistor 31 has the further effect of decreasing the input impedance of the amplifier.

Resistor 31 also helps eliminate any cross-over distortion which might be present in the output waveform. By "cross-over distortion" is meant distortion occurring in the output signal in the vicinity of the points where the output passes through a zero reference point, that is a point where the polarity of the output signal is neither positive nor negative. The problem of cross-over distortion is further mitigated by the fact that output transistor 14 has a small forward bias even when it is not driving the load.

Since the driver transistor 19 need not be a power-type transistor due to its relatively narrow voltage swing, a small signal transistor having excellent frequency response may be employed to provide degenerative feedback. Thus the oscillations and instability which sometimes occur when there is regenerative feedback from the output to the input of a power amplifier are substantially avoided. Power-type transistors are relatively slow in their speed of response. This being so, if feedback designed to be degenerative is provided around a number of power-type transistors, the signal fed back will not only on occasion not be 180° out of phase with the input signal, but in fact on occasion will become regenerative instead of degenerative. As a result instability and oscillations will result at higher frequencies. By using a fast transistor of the non-power-type, and by using a minimum of transistors of the said power-type, this invention not only saves on cost of components and achieves a high efficiency of power transfer to the load, but just as importantly it provides a greater degree of stability over a wider frequency range.

The amount of power dissipated by the three transistors is relatively low both in the quiescent and active states in this embodiment of the invention. Output transistor 10 conducts heavily only when the input signal is of positive polarity, and output transistor 12 conducts heavily only when the input signal is of negative polarity. This alternate conduction of the two output transistors helps increase the circuit's efficiency in transferring power to the load. The overall efficiency of the circuit is further improved by the fact that the driver transistor need not provide the full output voltage swing. Instead, as mentioned earlier, the output swing of this transistor need not exceed a few tenths of a volt. This being so, less power is dissipated in this stage and, equally important, a power-type transistor need not be used for the driver stage.

The circuit of this invention is particularly useful for Class AB operation, that is, for operation where the collector current of the output transistors 10 and 12 are each near or at zero for one half the cycle of the input signal. The particular half cycle when the collector current of each transistor would be such is that half cycle when the other output transistor is the primary current amplifying element.

Although this invention has been described with a certain degree of particularity, it is understood that the circuits in the drawings are intended as illustrative examples only, and changes in design may be made by one skilled in the art without departing from the spirit and scope of this invention.

What is claimed is:

1. A signal amplifying circuit comprising a driver transistor having base, emitter and collector elements; a first output transistor having base, emitter and collector elements with said last-named base element connected to the emitter element of said driver transistor; a second output transistor having base, emitter and collector elements with said last-named base element connected to the collector element of said first output transistor; input means connected to the base element of said driver transistor for applying an input signal; output means connected to the emitter element of said second output transistor for deriving an output signal; a first source of D.C. potential with its positive side connected to the collector element of said driver transistor and its negative side connected to a reference potential, a second source of D.C. potential with its positive side connected to the emitter element of said first output transistor and its negative side connected to the said reference potential; a third source of D.C. potential with its negative side connected to the collector element of said second output transistor and its positive side connected to the said reference potential; a first resistive element connected between the emitter element of said driver transistor and the negative side of said third source of D.C. potential; a second resistive element connected between the collector element of said first output transistor and the negative side of said third source of D.C. potential; a third resistive element connected between the emitter element of said second output transistor and the base element of said driver transistor; a fourth resistive element connected between the base and collector elements of said driver transistor; and unidirectional conducting means connected to permit current flow from the collector element of said first output transistor to the emitter element of said second output transistor.

2. The circuit of claim 1 in which a fifth resistive element is connected between the positive side of said first D.C. potential source and the collector element of said driver transistor, and a zener diode is connected between the collector element of said driver transistor and the emitter element of said first output transistor.

3. A signal amplifying circuit comprising:

an NPN driver transistor having base, emitter and collector elements, said base being adapted to receive an input signal, means to positively bias said driver transistor collector, a first PNP output transistor having base, emitter and collector elements, said last named base element being connected to said driver transistor emitter, means to positively bias said first output transistor emitter, a second PNP output transistor having base, emitter and collector elements, said last named base element being connected to said first output transistor collector, means to negatively bias said second output transistor collector, a first resistive element 29 connected between said driver transistor emitter and said second output transistor collector, a second resistive element connected between said collector elements of said output transistors, unidirectional current means connected to permit current flow from said first output transistor collector to said second output transistor emitter, and
a resistive feedback element connecting said second output transistor emitter to said driver transistor base.

4. The amplifying circuit of claim 3 further characterized by an output resistor connected to said second output transistor emitter.

5. A signal amplifying circuit comprising:
a PNP driver transistor having base, emitter and collector elements, said base being adapted to receive an input signal,
means to negatively bias said driver transistor collector,
a first NPN output transistor having base, emitter and collector elements, said last named base element being connected to said driver transistor emitter,
means to negatively bias said first output transistor emitter,
a second NPN output transistor having base, emitter and collector elements, said last named base element being connected to said first output transistor collector,
means to positively bias said second output transistor collector,
a first resistive element 29 connected between said driver transistor emitter and said second output transistor collector,
a second resistive element connected between said collector elements of said output transistors,
unidirectional current means connected to permit current flow from said second output transistor emitter to said first output transistor collector, and
a resistive feedback element connecting said second output transistor emitter to said driver transistor base.

6. The amplifying circuit of claim 5 further characterized by an output resistor connected to said second output transistor emitter.

References Cited by the Examiner

UNITED STATES PATENTS

| | | | |
|---|---|---|---|
| 2,744,169 | 5/1956 | Deming | 330—70 |
| 2,929,997 | 3/1960 | Cluwen | 330—18 |
| 3,023,368 | 2/1962 | Erath | 330—17 X |
| 3,124,758 | 3/1964 | Bellamy et al. | 330—18 |
| 3,182,268 | 5/1965 | Burwen | 330—20 X |

FOREIGN PATENTS 1,026,361 3/1958 Germany.

OTHER REFERENCES

Lin et al.: Single-Ended Amplifier for Class B Operation, Electronics, May 29, 1959, pp. 86–87.

ROY LAKE, *Primary Examiner*.

F. D. PARIS, *Assistant Examiner*.